(12) United States Patent
Liu et al.

(10) Patent No.: US 6,834,094 B1
(45) Date of Patent: Dec. 21, 2004

(54) HIGH-FREQUENCY MULTI-SELECTION PRESCALER

(75) Inventors: Feng-Ming Liu, Taipei (TW); Cheng-Wei Chen, Taipei (TW)

(73) Assignee: Richwave Technology Corp., Taipei (TW)

( * ) Notice: Subject to any disclaimer, the term of this patent is extended or adjusted under 35 U.S.C. 154(b) by 0 days.

(21) Appl. No.: 10/736,520

(22) Filed: Dec. 17, 2003

(30) Foreign Application Priority Data

Sep. 23, 2003 (TW) ......................................... 92126245 A

(51) Int. Cl.[7] ............................................... H03K 21/00
(52) U.S. Cl. ......................................... 377/47; 377/48
(58) Field of Search ........................................ 377/47, 48

(56) References Cited

U.S. PATENT DOCUMENTS 4,575,867 A * 3/1986 Hogue ........................ 377/110
6,462,595 B1 10/2002 Hsu et al. ..................... 327/215

* cited by examiner

*Primary Examiner*—Margaret R. Wambach
(74) *Attorney, Agent, or Firm*—Troxell Law Office PLLC

(57) ABSTRACT

A multi-selection prescaler for dividing an input signal according to a ratio to obtain a desired frequency. The circuit has of a plurality of logic gates and D-flip-flops: a first frequency divider for receiving an input signal and generating a divided frequency; a second frequency divider connected to the first frequency divider for performing a further frequency division based on a selection switch having a plurality of selection signals and a plurality of AND gates; a module control for performing a logic operation on the selection signals and an external control signal (MC) by OR gates and being connected to the first frequency divider to control the divided frequency of the first frequency divider; and an output selection circuit connected to the second frequency divider for selecting output signal according to the selection signals.

12 Claims, 4 Drawing Sheets

Truth Table

| MC | a | b | c | output |
|----|---|---|---|--------|
| 0 | 0 | 0 | 0 | div 16 |
| 1 | 0 | 0 | 0 | div 17 |
| 0 | 1 | 0 | 0 | div 32 |
| 1 | 1 | 0 | 0 | div 33 |
| 0 | 1 | 1 | 0 | div 64 |
| 1 | 1 | 1 | 0 | div 65 |
| 0 | 1 | 1 | 1 | div 128 |
| 1 | 1 | 1 | 1 | div 129 |

FIG. 4

HIGH-FREQUENCY MULTI-SELECTION PRESCALER

BACKGROUND OF THE INVENTION

1. Field of the Invention

The present invention relates to a high-frequency multi-selection prescaler. By using the prescaler, a divide ratio of the whole circuit can be controlled more effectively to obtain a divided frequency desired by a user.

2. Description of the Related Art

Recently, applications of high frequency technologies have grown rapidly because of the high advancement and development of electronic circuits and telecommunication systems. However, various frequency divider circuits are needed to process high frequency signals in a frequency synthesizer. Therefore, frequency dividers are broadly used in high frequency circuits. In particular, as great progress has been made in the field of electronic equipments such as computers and telecommunication devices, the configuration of frequency dividers has become a critical technique in high frequency circuit designs.

The technology of frequency divider circuits has been developed over the past decades and has been widely used in high frequency circuits. Typically, a prescaler is designed with a fixed divide ratio. FIG. 1A shows a conventional high frequency prescaler disclosed in U.S. Pat. No. 6,462,595. In the circuit of FIG. 1A, the divide ratio is fixed at 64/65, as shown in the truth table of FIG. 1B, and thus no other divide ratios are available for selection. In other words, the divide-by-64/65 prescaler does not provide any flexibility in the selection of divide ratios.

As can be seen from the above conventional circuit, current prescaler technologies fail to provide multiple divided frequencies on user demand. When a divide ratio other than the ratio of 64/65 is required by a user, the prescaler circuit has to be re-designed and the resulting re-designed divider has to be re-manufactured, which is time-consuming and also increases the cost. Therefore, in view of the above disadvantages, the inventor has proposed an inventive method and a novel apparatus to solve the problems with a simple structure at low cost, which can be utilized in a prescaler to provide a flexible divide ratio selection so that the prescaler does not need to be redesigned for each of the different divide ratios. As a result, a prescaler can be made with more flexibility and the manufacturing cost can be effectively reduced.

SUMMARY OF THE INVENTION

The present invention relates to a high-frequency multi-selection prescaler having a flexible divide ratio which can be controlled by a simple circuit for a user to easily obtain a desired frequency. By using a multi-bit selection signal with different logic levels, the divide ratio in a prescaler can be controlled on user demand.

Therefore, the high-frequency multi-selection prescaler according to the present invention is designed with a variable divide ratio for a user to obtain the desired frequency. The object of the present invention is to provide a divider circuit with expanded frequency selections, in which the divide ratio of the whole circuit can be effectively controlled through a selection switching means having a multi-bit selection signal input. To achieve the above object, the high-frequency multi-selection prescaler of the present invention comprises a first frequency divider for receiving an input signal and generating an output signal with a divided frequency through a frequency division process A second frequency divider is connected to the first frequency divider for performing a further frequency division process to the output signal from the first frequency divider on the basis of a selection switching means having a plurality of selection signals and a plurality of AND gates to form a divider circuit having expanded frequency selections. A module control performs a logic operation on the plurality of selection signals and an external control signal (MC) by an OR gate and sending an operation result to the first frequency divider to further control the divided frequency of the first frequency divider. An output selection circuit connected to the second frequency divider for performing a signal output selection in accordance with the plurality of selection signals. Thereby, the divided frequency desired by the user can be obtained and the reduction in manufacturing cost can be achieved.

BRIEF DESCRIPTION OF THE DRAWINGS

Features and advantages of the present invention will be fully understood from the detailed description to follow taken in conjunction with the embodiments as illustrated in the accompanying drawings, which are to be considered in all respects as illustrative and not restrictive, wherein:

FIG. 4 shows the truth table of the circuit in the preferred embodiment according to the present invention.

DETAILED DESCRIPTION OF PREFERRED EMBODIMENTS

Figures 1A, 1B:
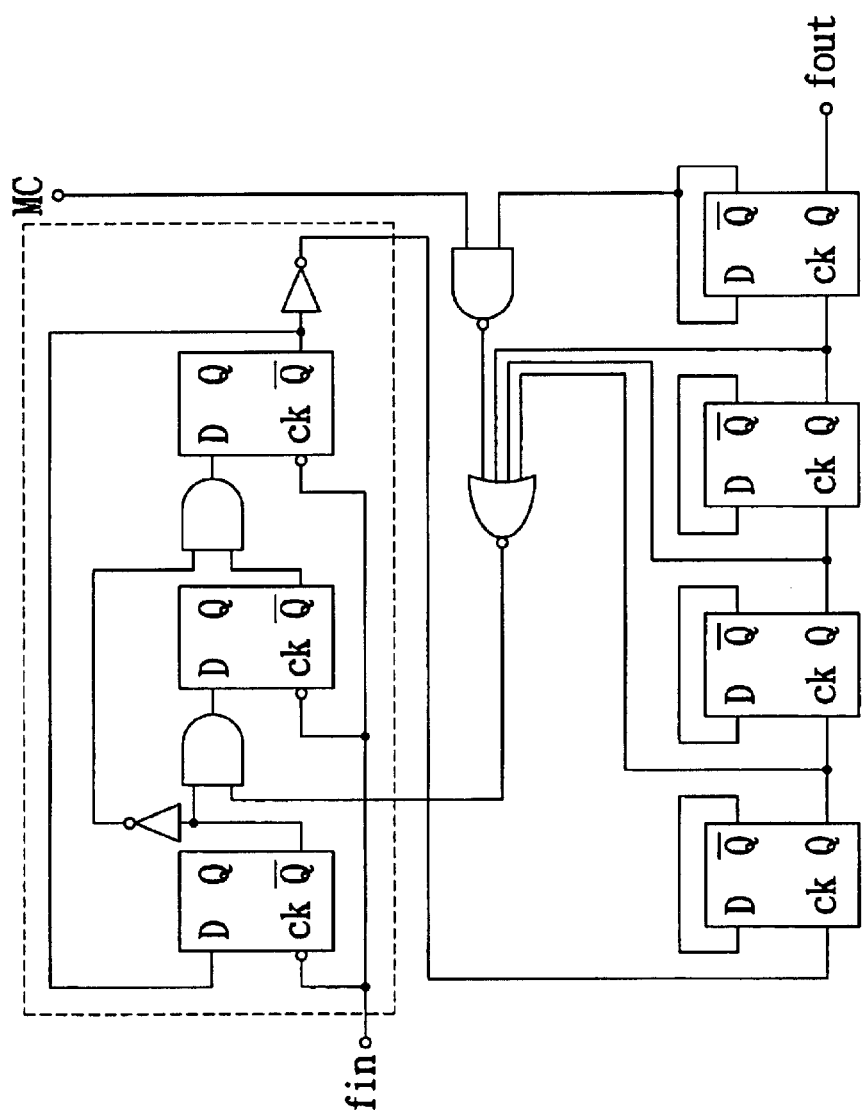
FIG. 1A depicts a schematic circuit diagram of a principal circuit disclosed in U.S. Pat. No. 6,462,595.
FIG. 1B shows the truth table of the principal circuit disclosed in U.S. Pat. No. 6,462,595
Figure 2:
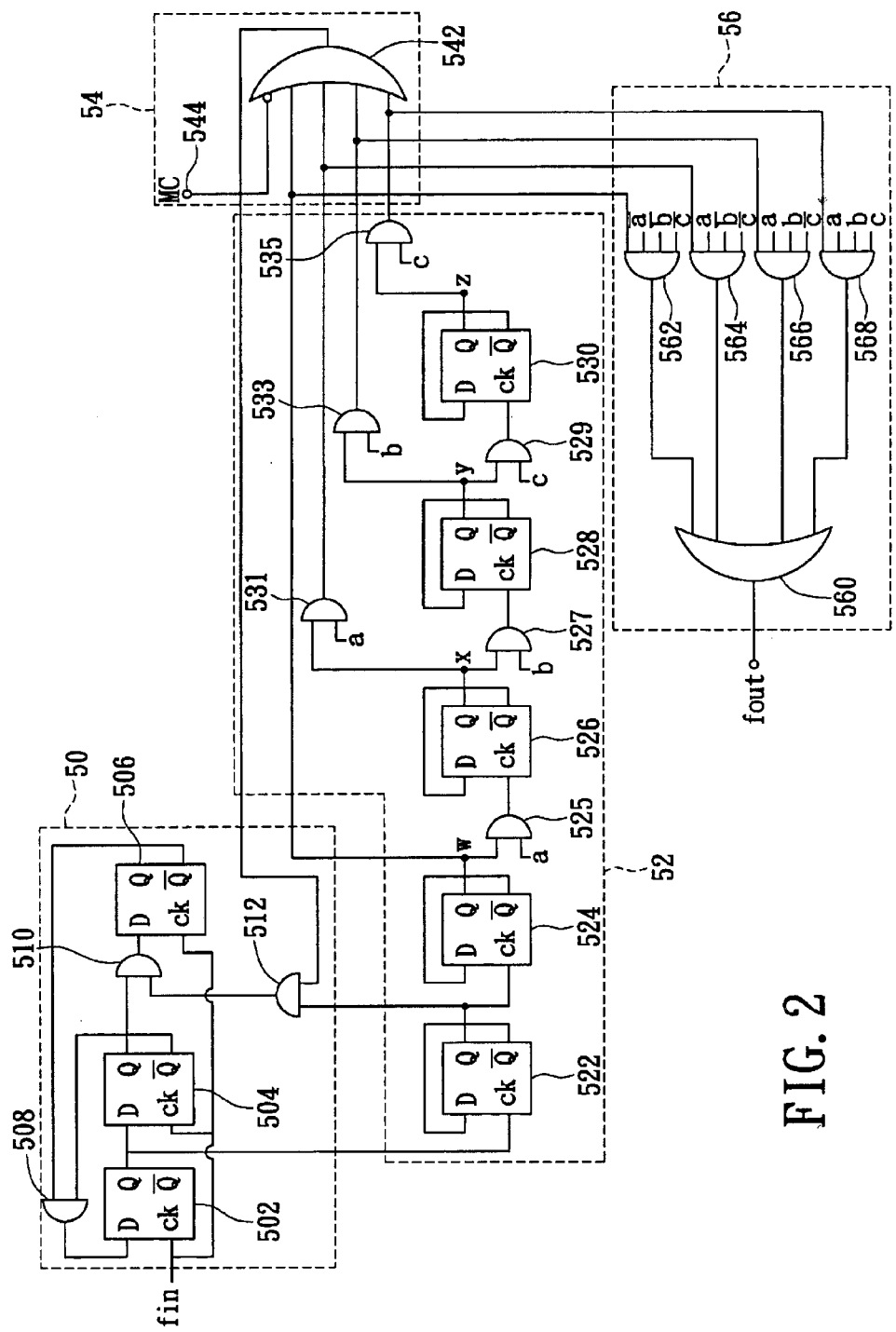
FIG. 2 shows main circuit blocks and components and the connection relation therebetween in the preferred embodiment according to the present invention.

Reference is made to FIG. 2, which shows a circuit diagram of a high-frequency multi-selection prescaler according to a preferred embodiment of the present invention. According to the invention, an input signal is first fed into a first frequency divider 50 comprising a first flip-flop 502, a second flip-flop 504 and a third flip-flop 506. In the first frequency divider 50, the first flip-flop 502 is connected with the second flip-flop 504 to form a divide-by-4 frequency divider and an inverting output of the third flip-flop 506 and an inverting output of the second flip-flop 504 are both connected to a first AND gate 508 to perform a logic AND operation. With the thus-connected third flip-flop 506, the first frequency divider 50 may become a divide-by-5 frequency divider, which has a divide ratio of an odd number with regard to the whole prescaler circuit. (A detailed description will be given later.)

As described above, the output signal from the first frequency divider 50 is connected to a second frequency divider 52. As a signal passes through each D-flip-flop, the frequency thereof will be further divided by 2. That is, after passing through a fourth flip-flop 522 and a fifth flip-flop 524, the input signal is divided by 16 (assuming that the third flip-flop 506 does not operate), and an output Q of the fifth flip-flop 524 is "1", i.e., the voltage level at the node w is "1" or in a HIGH state. Thereafter, the signal enters into a 3-bit selection switching means.

Referring to FIG. 3 and again to FIG. 2, when all the voltage levels of an externally applied first selection signal a, a second selection signal b and a third selection signal c are "0" or in a LOW state, output signals of a fourth AND gate 525, a fifth AND gate 527 and a sixth AND gate 529 are all in a LOW state after the logic AND operations, which results in no operations in a sixth flip-flop 526, a seventh flip-flop 528 and an eighth flip-flop 530.

Figure 3A:
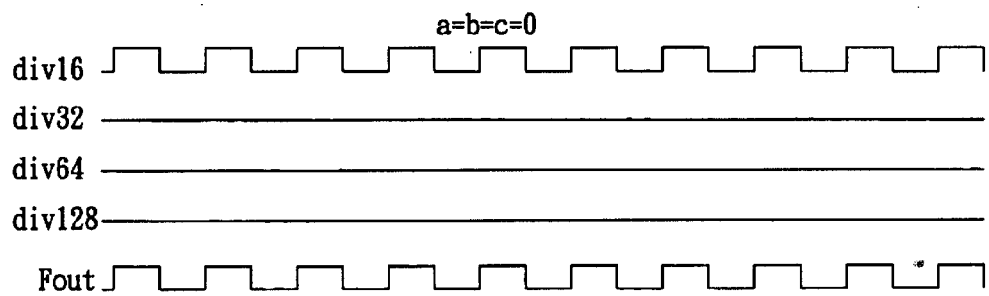
FIG. 3A illustrates the selection signals and output waveforms corresponding to the divide-by-16 case in the preferred embodiment according to the present invention.

Consequently, the HIGH level at the node w is sent via a connecting circuit to a tenth AND gate 562 in an output selection circuit 56 to perform a logic AND operation with an inverted signal of the first selection signal, an inverted signal of the second selection signal and an inverted signal of the third selection signal. The operation result is in turn fed into a second OR gate 560 to perform a logic OR operation and finally an output signal with a frequency at $\frac{1}{16}$ of the original input frequency can be obtained, forming a divide-by-16 prescaler, as shown in FIG. 3A.

Figure 3B:
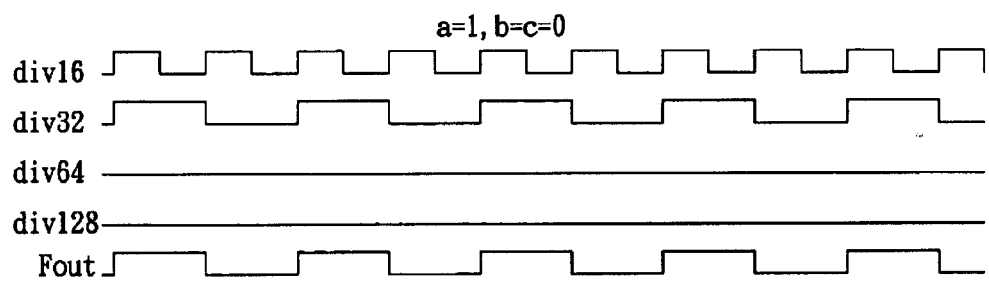
FIG. 3B illustrates the selection signals and output waveforms corresponding to the divide-by-32 case in the preferred embodiment according to the present invention.

Similarly, when the voltage level of the first selection signal a is "1" or in a HIGH state and the voltage levels of the second selection signal b and the third selection signal c are both "0" or in a LOW state, the output signals of the fifth AND gate 527 and the sixth AND gate 529 are both in a LOW state after the logic AND operations, which results in no operations in the seventh flip-flop 528 and the eighth flip-flop 530, while the output of the fourth AND gate 525 is in a HIGH state after performing the logic AND operation to the signal at the node w and the first selection signal a, which results in an operation in the sixth flip-flop 526 so that its output'signal Q is "1", i.e., the voltage level at the node x is "1" or in a HIGH state. At this time, the input signal is divided by 32. Then, the signal at the node x and the first selection signal a are connected to a seventh AND gate 531 for performing a logic AND operation, and the output logic HIGH signal is sent via a connecting circuit to an eleventh AND gate 564 in the output selection circuit 56 to perform a logic AND operation with the first selection signal a, the inverted signal of the second selection signal and the inverted signal of the third selection signal. The operation result, together with the signal at the output of the tenth AND gate 562 (as described above), is in turn fed into the second OR gate 560 to perform a logic OR operation and finally an output signal with a frequency at $\frac{1}{32}$ of the original input frequency can be obtained, forming a divide-by-32 prescaler, as shown in FIG. 3B.

Figure 3C:
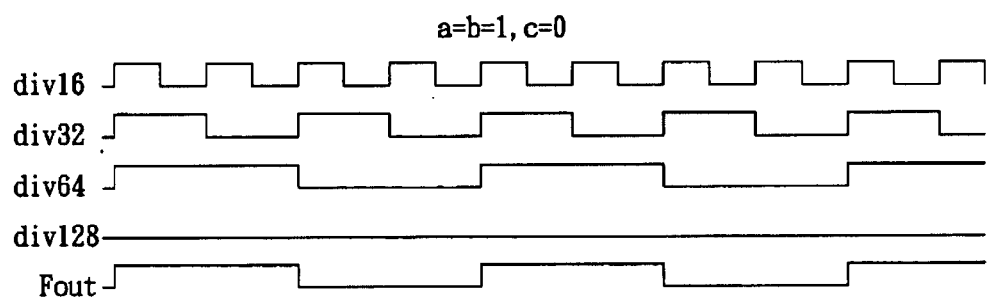
FIG. 3C illustrates the selection signals and output waveforms corresponding to the divide-by-64 case in the preferred embodiment according to the present invention.

When the voltage levels of the first selection signal a and the second selection signal b are "1" or in a HIGH state (as described above, resulting in an operation in the sixth flip-flop 526 so that the signal at the node x is "1") and the voltage level of the third selection signal c is "0" or in a LOW state, the output signal of the sixth AND gate 529 is in a LOW state after the logic AND operation, which results in no operation in the eighth flip-flop 530, while the output of the fifth AND gate 527 is in a HIGH state after performing the logic AND operation to the signal at the node x and the second selection signal b, which results in an operation in the seventh flip-flop 528 so that its output signal Q is "1", i.e., the voltage level at the node y is "1" or in a HIGH state. At this time, the input signal is divided by 64. Then, the signal at the node y and the second selection signal b are connected to an eighth AND gate 533 for performing a logic AND operation, and the output logic HIGH signal is sent via a connecting circuit to a twelfth AND gate 566 in the output selection circuit 56 to perform a logic AND operation with the first selection signal a, the second selection signal b and the inverted signal of the third selection signal The operation result, together with the signals at the outputs of the tenth AND gate 562 and the eleventh AND gate 564 (as described above), is in turn fed into the second OR gate 560 to perform a logic OR operation and finally an output signal with a frequency at $\frac{1}{64}$ of the original input frequency can be obtained, forming a divide-by-64 prescaler, as shown in FIG. 3C.

Figure 3D:
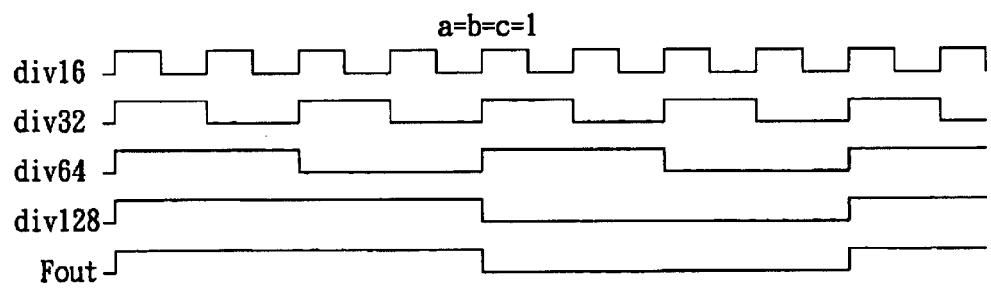
FIG. 3D illustrates the selection signals and output waveforms corresponding to the divide-by-128 case in the preferred embodiment according to the present invention.

When all the voltage levels of the first selection signal a, the second selection signal b and the third selection signal c are "1" or in a HIGH state (as described above, resulting in operations in the sixth flip-flop 526 and the seventh flip-flop 528 so that the signal at the node y is "1"), the output signal of the sixth AND gate 529 is in a HIGH state after performing the logic AND operation on the signal at the node y and the third selection signal c, which results in an operation in the eighth flip-flop 530 so that its output signal Q is "1", i.e., the voltage level at the node z is "1" or in a HIGH state. At this time, the input signal is divided by 128. Then, the signal at the node z and the third selection signal c are connected to a ninth AND gate 535 for performing a logic AND operation, and the output logic HIGH signal is sent via a connecting circuit to a thirteenth AND gate 568 in the output selection circuit 56 to perform a logic AND operation with the first selection signal a, the second election signal b and the third selection signal c. The operation result, together with the signals at the outputs of the tenth AND gate 562, the eleventh AND gate 564 and the twelfth AND gate 566, is in turn fed into the second OR gate 560 to perform a logic OR operation and finally an output signal with a frequency at $\frac{1}{128}$ of the original input frequency can be obtained, forming a divide-by-128 prescaler, as shown in FIG. 3D.

Referring to the truth table in FIG. 4, an external control signal (MC) 544 in a module control 54 is used for controlling whether or not the output signal of the high-frequency multi-selection prescaler is to be divided by an odd number. The inverted signal of the external control signal (MC) 544, together with the input signals of the tenth AND gate 562, the eleventh AND gate 564, the twelfth AND gate 564 and the thirteenth AND gate 568, is connected to a first OR gate 542 for performing a logic OR operation. The output of the first OR gate 542 is further connected to the input of the third fliflop 506 through the second and the third AND gates 510 and 512 to thereby control the operation of the third flip-flop 506. When the voltage level of the external control signal (MC) 544 is "0" or in a LOW state, the third flip-flop 506 does not operate so that the first frequency divider 50 acts as a divide-by-4 frequency divider and the output signal of the high-frequency multi-selection prescaler is to be divided by an even number. On the other hand, when the voltage level of the external control signal (MC) 544 is "1" or in a HIGH state, the third flip-flop 506 operates so that the first frequency divider 50 acts as a divide-by-5 frequency divider and the output signal of the high-frequency multi-selection prescaler is to be divided by an odd number.

In summary, the high-frequency multi-selection prescaler apparatus and method according to the present invention are designed with expanded frequency selections to provide multiple divided frequencies by using a simple structured logic circuit. The disadvantages of the time- and cost-consuming circuit re-design in the prior art divider is thus overcome.

While the present invention has been described with reference to the detailed description and the drawings of the preferred embodiment thereof, it is to be understood that the invention should not be considered as limited thereby. Various modifications and changes could be conceived of by those skilled in the art without departing from the scope of the present invention, which is indicated by the appended claims.

What is claimed is:

1. A high-frequency multi-selection prescaler adapted for a high-frequency divider circuit, comprising:
a first frequency divider for receiving an input signal and generating an output signal with a divided frequency through a frequency division process;
a second frequency divider connected to said first frequency divider for performing a further frequency division process on said output signal from said first frequency divider on the basis of a selection switching means having a plurality of selection signals and a plurality of AND gates;
a module control for performing a logic operation on said plurality of selection signals and an external control signal (MC) by at least one OR gate and sending an operation result to said first frequency divider to control said divided frequency of said first frequency divider; and
an output selection circuit connected to said second frequency divider for performing a signal output selection in accordance with said plurality of selection signals;
whereby, through the combination of said first frequency divider and said second frequency divider, along with the control of said module control, a divider circuit having expanded frequency selections is formed to provide multiple divided frequencies.

2. The high-frequency multi-selection prescaler of claim 1, wherein said first frequency divider consists of a plurality of D-flip-flops and a plurality of AND gates.

3. The high-frequency multi-selection prescaler of claim 1, wherein said second frequency divider consists of a plurality of D-flip-flops and a plurality of AND gates and is adjustable according to a divide ratio required by a user.

4. The high-frequency multi-selection prescaler of claim 1, wherein said module control controls said divided frequency of said first frequency divider on the basis of the voltage level of said external control signal (MC).

5. The high-frequency multi-selection prescaler of claim 1, wherein said output selection circuit consists of a plurality of AND gates and an OR gate, and wherein said output selection circuit is connected to said second frequency divider and performs the signal output selection in accordance with said plurality of selection signals.

6. The high-frequency multi-selection prescaler of claim 1, wherein said second frequency divider operates on the basis of the selection switching means having said plurality of selection signals and said plurality of AND gates to control a divided frequency of the whole circuit.

7. The high-frequency multi-selection prescaler of claim 6, wherein said selection switching means of said second frequency divider operates in coordination with said output selection circuit to perform the signal output selection and control the divided frequency of the whole circuit.

8. A high-frequency multi-selection prescaler adapted for a high-frequency divider circuit, comprising:
a first frequency divider consisting of a plurality of D-flip-flops and a plurality of AND gates for receiving an input signal and generating an output signal with a divided frequency through a frequency division process;
a second frequency divider consisting of a plurality of D-flip-flops and a plurality of AND gates and being connected to said first frequency divider for adjusting a divide ratio and performing a further frequency division process on said output signal from said first frequency divider on a basis of a selection switching means having a plurality of selection signals and a plurality of AND gates;
a module control for performing a logic operation on said plurality of selection signals and an external control signal (MC) by at least one OR gate and sending an operation result to said first frequency divider to control said divided frequency of said first frequency divider; and
an output selection circuit connected to said second frequency divider for performing a signal output selection in accordance with said plurality of selection signals;
whereby, through combination of said first frequency divider and said second frequency divider, along with control of said module control, a divider circuit having expanded frequency selections is formed to provide multiple divided frequencies.

9. The high-frequency multi-selection prescaler of claim 8, wherein said module control controls said divided frequency of said first frequency divider on the basis of the voltage level of said external control signal (MC).

10. The high-frequency multi-selection prescaler of claim 8, wherein said output selection circuit consists of a plurality of AND gates and an OR gate, and wherein said output selection circuit is connected to said second frequency divider and performs the signal output selection in accordance with said plurality of selection signals.

11. The high-frequency multi-selection prescaler of claim 8, wherein said second frequency divider operates on a basis of the selection switching means having said plurality of selection signals and said plurality of AND gates to control a divided frequency of the whole circuit.

12. The high-frequency multi-selection prescaler of claim 11, wherein said selection switching means of said second frequency divider operates in is coordination with said output selection circuit to perform the signal output selection and control the divided frequency of the whole circuit.

* * * * *